DEVICE COMPRISING A SEMICONDUCTOR SWITCH FOR ADJUSTING THE POWER SUPPLIED TO AN ELECTRIC APPARATUS BY AN ALTERNATING-CURRENT SOURCE

Filed July 29, 1964 2 Sheets-Sheet 1

INVENTORS
Jean-Pierre Biet
Jean Chaupit
By Paul M. Craig, Jr.
ATTORNEY

DEVICE COMPRISING A SEMICONDUCTOR SWITCH FOR ADJUSTING THE POWER SUPPLIED TO AN ELECTRIC APPARATUS BY AN ALTERNATING-CURRENT SOURCE

Filed July 29, 1964 2 Sheets-Sheet 2

INVENTORS
Jean-Pierre Biet
Jean Chaupit
By Paul M. Craig, Jr.
ATTORNEY

United States Patent Office 3,333,182

Patented July 25, 1967

3,333,182

DEVICE COMPRISING A SEMICONDUCTOR SWITCH FOR ADJUSTING THE POWER SUPPLIED TO AN ELECTRIC APPARATUS BY AN ALTERNATING-CURRENT SOURCE

Jean-Pierre Biet, Saulx-les-Chartreux, and Jean Chaupit, Fontenay-aux-Roses, France, assignors to Compagnie Generale d'Electricite, Paris, France Filed July 29, 1964, Ser. No. 386,006
Claims priority, application France, July 30, 1963, 943,126
4 Claims. (Cl. 323—22)

The invention concerns static semiconductor switch devices intended to permit the adjustment of the power supplied by an electric alternating-current source to a load. By "semiconductor switch" is meant a component which is capable of having, under certain conditions, either a very high resistance or a very low resistance.

There is disclosed in U.S. patent application Ser. No. 367,470 filed in the name of Jean-Pierre Biet, "Symmetrically operating device for rendering a circuit non-conductive and conductive," filed on May 14, 1964, an improved semiconductor switch which has the following three properties:

It is symmetrical, i.e. it permits the passage of current in both directions;

It can be struck by a controlled electrode;

It can be rendered non-conductive by this same electrode.

The same patent also discloses an assembly consisting of the said semiconductor switch and its control circuit.

The present invention is more particularly applicable to this assembly, but it is also applicable to symmetrical switches adapted to be struck by a control electrode, but which cannot be rendered non-conductive by this electrode.

The device according to the invention for the adjustment of the power supplied by an alternating-current source to a load by means of a static switch assembly consisting in known manner of a symmetrical semiconductor component connected in series by its two supply terminals between the said source and the said apparatus, and of a control transformer, of which one winding is connected between a control electrode of the said semiconductor component and the common point of two diodes, which are on the other hand connected respectively to the two supply terminals of the said component, is distinguished notably by the fact that it comprises two networks each comprising a potentiometer connected to the terminals of the alternating-current source through a rectifier, the rectifiers of the two networks being oriented in opposite directions and the sliders of the potentiometers being ganged, a first Zener effect diode connected in series with a first resistance, between the slider and one end of the corresponding potentiometer, and a second Zener effect diode connected in series with a second resistance, to the terminals of the said first resistance, the said second diodes of the two networks being connected respectively to two other windings of the control transformer of the static switch assembly.

Further features of the device according to the invention will become apparent from the following description of various constructional forms of the said device.

Figure 1:
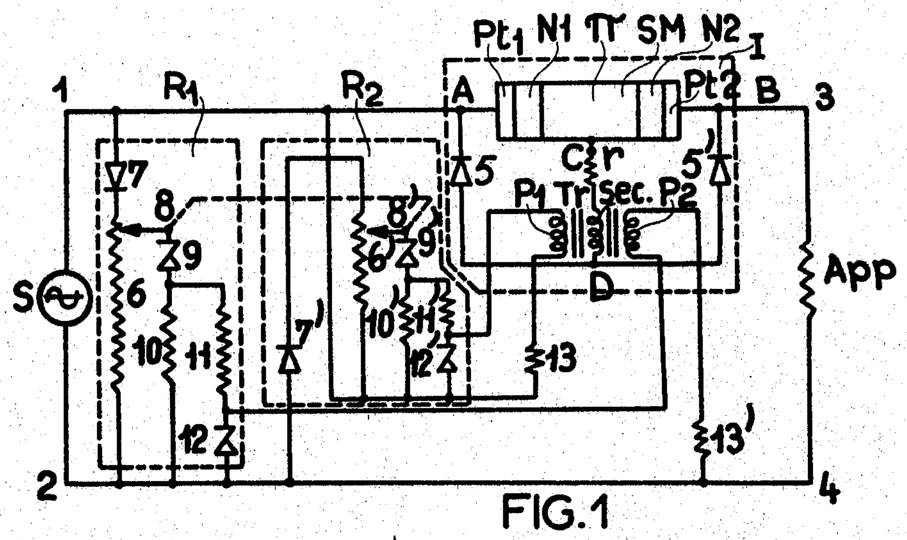
FIGURE 1 illustrates a symmetrical switch adapted to be struck and rendered non-conductive, and its control device.

In FIGURE 1, there are denoted by 1 and 2 the input terminals of the device, to which is connected the source S of alternating current, of frequency F and having the period T, and by 3 and 4 its output terminals, to which is connected the apparatus A*pp* to be supplied.

On the other hand, I denotes a static switch assembly of the symmetrical type which is adapted to be struck and rendered non-conductive and which comprises a semiconductor component SM consisting in known manner of a high-resistivity p-type centre layer $\pi$, enclosed between two n-type layers $N_1$, $N_2$ having medium doping, which are in turn enclosed between two p-type layers $Pt_1$, $Pt_2$ having strong doping. A and B denote the supply terminals of the said component, which are connected respectively to the outermost layers $Pt_1$ and $Pt_2$ and which are inserted between the terminals 1 and 3.

The switch assembly I also comprises in known manner a control circuit consisting of a secondary winding S*ec* of a transformer $T_r$ of the differentiating type or of the high-pass filter effect type, which is connected through a resistance *r* between a control electrode C of the component SM and the common point D of two diodes 5, 5', which are in turn connected to the supply terminals A and B respectively of the said component.

According to the invention, this device is completed as follows for the purpose of enabling the energy supplied by the source S to the apparatus A*pp* to be adjusted.

Two identical networks $R_1$ and $R_2$ each comprise a potentiometer 6 (6'), the winding ends of which are connected through a diode 7 (7') to the input terminals 1, 2. Connected between the slider 8 (8') of the said potentiometer and its winding end further from the rectifier 7 (7') is the series assembly formed of a first Zener effect diode 9 (9') and of a resistance 10 (10'). Connected to the terminals of the latter is a series assembly comprising a resistance 11 (11') and a second Zener effect diode 12 (12.). The said second Zener effect diodes are connected, respectively, through resistances 13, 13' to two primary windings $P_1$, $P_2$ of the transformer T*r*.

The sliders 8, 8' of the two potentiometers 6, 6' are mechanically ganged, and it is by operation thereof that the power supplied by the source S to the load apparatus A*pp* is adjusted.

Figure 2:
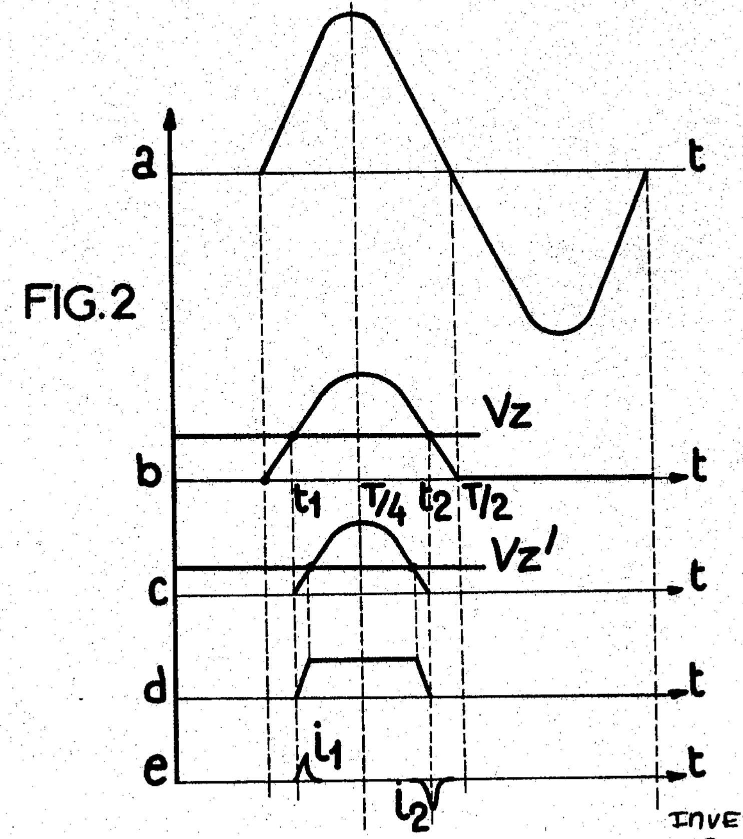
FIGURE 2 shows voltage curves from which the operation of the device according to FIGURE 1 will be understood.

The graphs of FIGURE 2 illustrate the operation of this device. This figure relates only to the operation of the network $R_1$ connected to the source S through the rectifier 7, which transmits only the half-cycles of a particular direction (called "positive") of the voltage of the source S. The operation of the network $R_2$ connected to the source S through the rectifier 7' transmits only the half-cycles of the other direction of the said voltage of the said source and is of similar form, the polarities merely being reversed.

The graph *a* represents the variation as a function of time of the voltage $V_1-V_2$ supplied by the source S to the input terminals 1, 2 of the device.

The graph *b* represents the variation of the voltage $U_b$ between the slider 8 of the potentiometer 6 and the terminal 2.

The graph *c* represents the variation of the voltage $U_c$ cross the terminals of the resistance 10. It will be seen that the voltage $U_c$ is different from zero only during the interval $t_1-t_2$, $t_1$ and $t_2$ being on either side of $T/4$, at which the voltage $U_b$ is higher than the breakdown voltage $V_z$ of the Zener effect diode 9, this voltage $U_c$ being equal to $U_b-V_z$.

The graph *d* represents the variation of the voltage $U_d$ in the form of a square wave across the terminals of the Zener effect diode 12. This voltage is limited to the value of the breakdown voltage $V'_z$ of the Zener effect diode 12 and it is then equal to this breakdown voltage, $V'_z$, which may be equal to $V_z$.

The graph *e* represents the pulses collected at the terminals of the winding S*ec* of the differentiating transformer $T_r$. For each half-cycle of the voltage of the source S, there is obtained a pair of pulses $i_1$, $i_2$ of opposite polarities, as is well known from the effects of the differentiating network on square-wave edges. The positive pulse $i_1$ produces the striking of the static switch, and the negative pulse $i_2$ renders it non-conductive, that is to say, the component is conductive between the pulses $i_1$ and $i_2$ corresponding to a half-cycle of the voltage of S, and is non-conductive during the remainder of the said half-cycle.

It will be seen that if the sliders 8, 8' of the potentiometers 6, 6' are close to their lowermost position (FIGURE 1), the maximum voltage between the terminals 8, 2 (8', 2') is low, and consequently the duration of the wave $U_c$ and of the square wave $U_d$ is small, and the pulses are close together on either side of *T*/4. Likewise, the other half-cycle of the voltage of the source S supplies two pulses (not shown) which are close together. Consequently, the semiconductor switch SM is struck only during a short interval and the apparatus A*pp* is fed only during a small fraction of the period of the voltage of the source S, and the power supplied is low. If the sliders 8, 8' are below a certain limit, no further striking pulses are set up, and the pulse supplied is zero. If, on the other hand, the sliders 8, 8' are close to their uppermost position (FIGURE 1), the power supplied to the load apparatus is high, and with the sliders in extreme positions, it reaches a maximum value $$P=\frac{V^2}{R}$$

V representing the effective value of the voltage of the source S, and R the impedance of the load apparatus A*pp*.

The invention also relates to a device such as that illustrated in FIGURE 1, but not including the diodes 7 and 7'. The latter may be disposed with because the voltage across the terminals of the Zener effect diodes, excited in the forward direction during one half-cycle out of two of the voltage of the source S, is negligible and, under these conditions, such diodes supply no pulses. However, the presence of these diodes is advantageous because they reduce the losses by preventing any passage of current during every other half-cycle, through that one of the two networks $R_1$, $R_2$ which is not in use.

The invention further relates to a variant of the device according to FIGURE 1, which comprises only one control network.

This network is characterised by the fact that it comprises two potentiometers having ganged sliders, connected together the windings of which are both connected in parallel to the alternating-voltage source each through two diodes inserted at their ends. The remainder of the network, from the common slider of the potentiometers, is the same as that of the two networks according to FIGURE 1.

Figure 3:
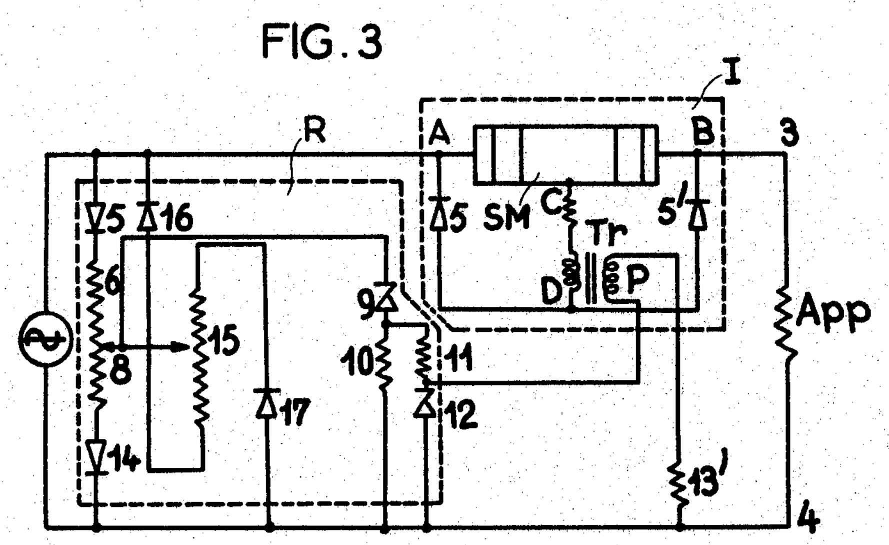
FIGURE 3 illustrates a variant of the device according to FIGURE 1.

FIGURE 3 illustrates such an arrangement. The references therein have the same meaning as in FIGURE 1. The winding 6 of the first potentiometer is connected to the source S by two rectifiers 5 and 14, and the winding 15 of the second potentiometer is connected to the source S by two rectifiers 16 and 17. The output of the said network R is connected to a single primary winding P of the differentiating transformer $T_r$.

The invention may also be employed in combination with a symmetrical static switch which is adapted to be struck but not to be rendered non-conductive.

Each network of the arrangement according to this variant is characterised by the fact that the primary winding of the control transformer of the static switch assembly is directly connected to the terminals of the resistance in series with the first aforesaid Zener effect diode, the aforesaid second Zener effect diode and the associated resistance being omitted.

Figure 4:
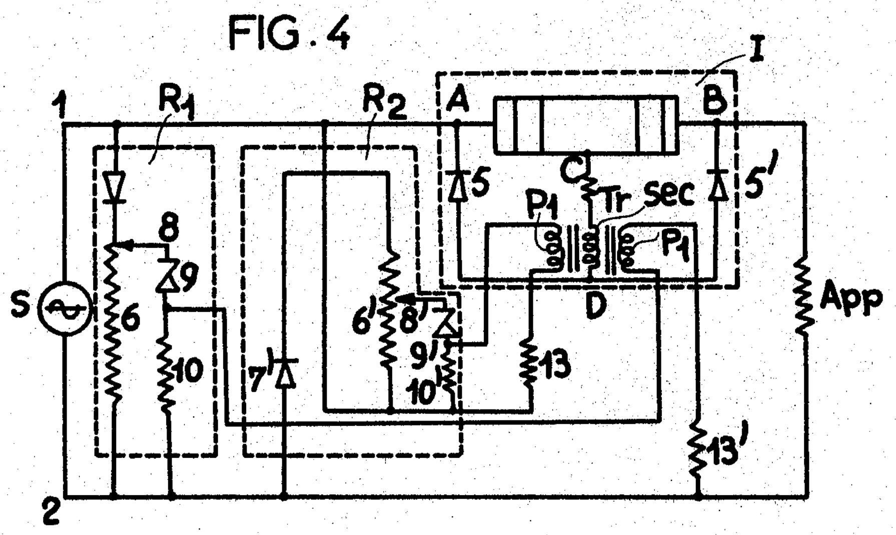
FIGURE 4 is a diagram of the device according to the invention, comprising a strikable symmetrical switch which is not adapted to be rendered non-conductive.

FIGURE 4 illustrates such a variant. Apart from the aforesaid difference, it is identical to FIGURE 1.

In this variant, the semiconductor component of the static switch assembly is rendered non-conductive when the voltage is cut off from its supply terminals AB, but it cannot be rendered non-conductive by applying a pulse to its control electrode C. It is struck by applying to the said control electrode, through the transformer $T_r$, a voltage of a level above the aforesaid value and having the desired polarity. It is no longer necessary for the transformer $T_r$ to be of the differentiating type. The sliders 8 and 8' of the potentiometers 6 and 6' of the two networks may be mechanically coupled together as in FIGURE 1. The adjustment of the power supplied to the apparatus A*pp* may be effected between *P*/2 and P, P having the above defined value. Referring to FIGURE 1, the striking is initiated at the instant when the voltage $U_c$ is set up at the time $t_1$. This time $t_1$ may be delayed until the voltage passes through the peak value by lowering the sliders 8, 8' of the potentiometers. The power will then be supplied to the apparatus A*pp* during one half of each half-cycle. Each half-cycle will supply a power adjustment between *P*/4 and *P*/2, and the whole of the cycle will supply a power adjustable between *P*/2 and P. If the position of the sliders 8 and 8' is further lowered, no striking will be obtained, because the maximum voltage $U_c$ obtained will be insufficient to trigger it. This is zero adjustment. Therefore, the adjustment *P*=0 and an adjustment variable from *P*/2 to P are available.

On the other hand, the two sliders may be rendered independent of one another. Under these conditions, the adjustment *P*=0 and an adjustment variable between *P*/4 and P are available.

In accordance with what has been explained in the foregoing, the following adjustment combinations can be obtained in accordance with the adjustments of the two potentiometers.

| Half-cycle +(−) | Half-cycle −(+) | Total |
|---|---|---|
| 0 | 0 | P=0. |
| 0 | Variable from P/4 to P/2. | P variable from P/4 to P/2. |
| Variable from P/4 to P/2. | do | P variable from P/2 to P. |

The various constructional forms of the device according to the invention may be very readily adapted to the case where the supply source supplies a polyphase current.

The device according to the invention is also applicable to a symmetrical switch formed by the association of two non-symmetrical switches connected in parallel push-pull. In this case, each switch receives the control pulses from a separate two-winding transformer. These transformers are of the differentiating type if the semiconductor component of the non-symmetrical static switch is adapted to be struck and rendered non-conductive. They are of the usual type if the non-symmetrical semiconductor component is adapted to be struck, but not to be rendered non-conductive.

Of course, the invention is in no way limited to the embodiments described and illustrated, which have been referred to only by way of example.

We claim:

1. Device for adjusting the energy supplied by an alternating-current source to an electric apparatus by means of a static switch assembly consisting of a symmetrical semiconductor component connected in series by its two supply terminals between the said source and the said apparatus, and of a control transformer whose secondary winding is connected between a control electrode of the said semiconductor component and the common point of two diodes which are connected, respectively, to the two supply terminals of the said component, the said device being characterised by the fact that it comprises two networks each comprising a potentiometer connected to the terminals of the alternating-current source through a rectifier—the rectifiers of the two networks being oriented in different directions and the sliders of the potentiometers being coupled—a first Zener effect diode connected in series with a first resistance between the slider and one end of the corresponding potentiometer, the second Zener effect diode connected in series with a second resistance to the terminals of the first resistance, the said second diode of the two networks being connected respectively, to two other windings of the control transformer of the static switch assembly.

2. Device according to claim 1, characterised by the fact that the two networks are connected to form a single network comprising two ganged and interconnected potentiometers, the said potentiometers being connected to the terminals of the source each though two rectifiers inserted at their ends and oriented in opposite directions, and on the other hand a first Zener effect diode connected in series with a first resistance between the sliders of the potentiometers and one terminal of the source, and a second Zener effect diode connected in series with a second resistance to the terminals of the first resistance, the said second Zener effect diode being connected to the primary winding of the control transformer.

3. Device according to claim 1, characterised by the fact that, in the case where the semi-conductor component of the static switch is of the strikable type but is not adapted to be rendered non-conductive, the device comprises two networks each comprising a potentiometer connected to the terminals of the alternating-current source through a rectifier—the rectifiers of the two networks being oriented in opposite directions and the sliders of the potentiometers being ganged—a Zener effect diode connected in series with a resistance between the slider and one end of the corresponding potentiometer, the said Zener effect diodes of the two networks being connected, respectively, to two other windings of the control transformer of the static switch assembly.

4. Device according to claim 3, characterised by the fact that the sliders of the potentiometers are independent.

No references cited.

JOHN F. COUCH, *Primary Examiner.*

M. L. WACHTELL, *Assistant Examiner.*